United States Patent [19]

Owens et al.

[11] 4,326,270
[45] * Apr. 20, 1982

[54] PRESET CIRCUIT FOR INFORMATION STORAGE DEVICES

[75] Inventors: William K. Owens, Sunnyvale; Steven R. Kahermanes, San Jose, both of Calif.

[73] Assignee: Fairchild Camera and Instrument Corp., Mountain View, Calif.

[*] Notice: The portion of the term of this patent subsequent to Oct. 23, 1996, has been disclaimed.

[21] Appl. No.: 58,638

[22] Filed: Jul. 19, 1979

Related U.S. Application Data

[62] Division of Ser. No. 931,637, Aug. 7, 1978.

[51] Int. Cl.$^3$ .............................................. G11C 11/40
[52] U.S. Cl. .................................... 365/218; 365/189
[58] Field of Search ................. 365/218, 174, 189, 230

[56] References Cited
U.S. PATENT DOCUMENTS 4,051,464  9/1977  Huang .............................. 365/218
4,068,217  1/1978  Arnett et al. .................... 365/218
4,099,196  7/1978  Simko .............................. 365/218

Primary Examiner—Terrell W. Fears
Attorney, Agent, or Firm—Paul J. Winters; Michael J. Pollock; Warren M. Becker

[57] ABSTRACT

An electronic circuit for simultaneously erasing all the information stored in an electronic information storage device and entering a predetermined new pattern of information into the storage device comprises a plurality of bistable semiconductor cells with an additional transistor current-conducting region included on a predetermined side of each cell. The additional current-conducting regions in the cells along each word row are coupled to an additional word line which connects to a current switch for the row. At an appropriate pulse signal, the current switch activates to switch row current temporarily from the standard current-source word line, which conducts holding current to the row during normal operation, to the additional word line, thereby erasing the old data and entering the new information bits.

12 Claims, 10 Drawing Figures

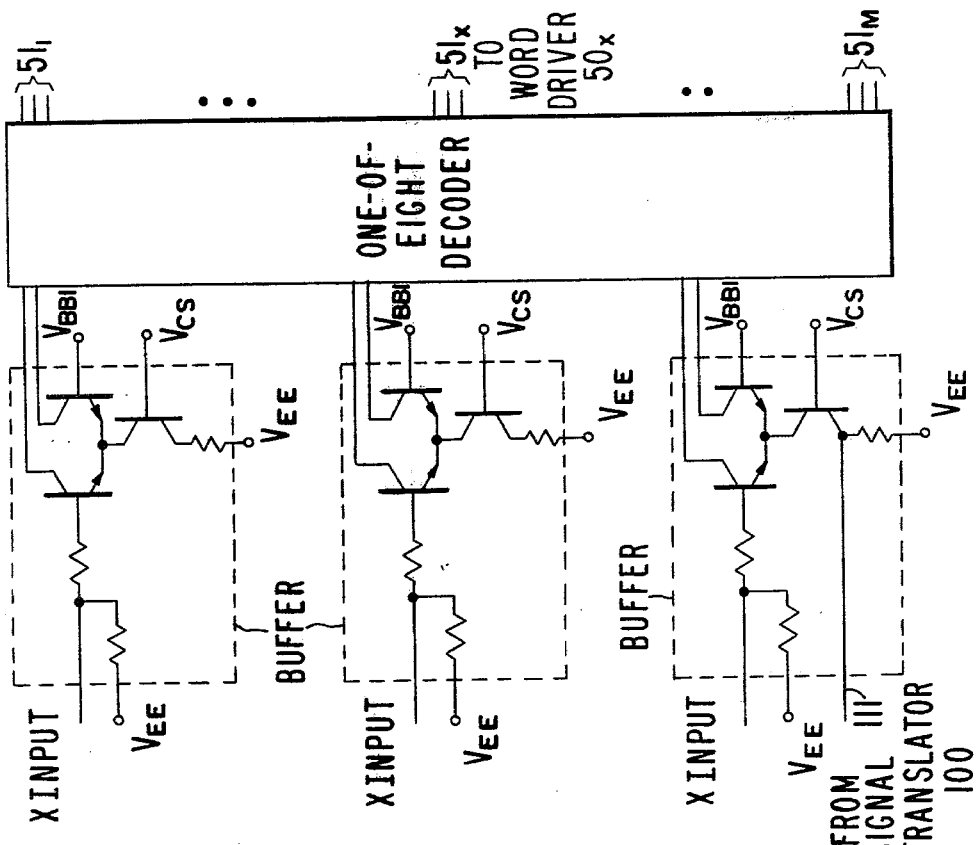
FIG. 2b WORD-LINE ADDRESS CIRCUITRY 60
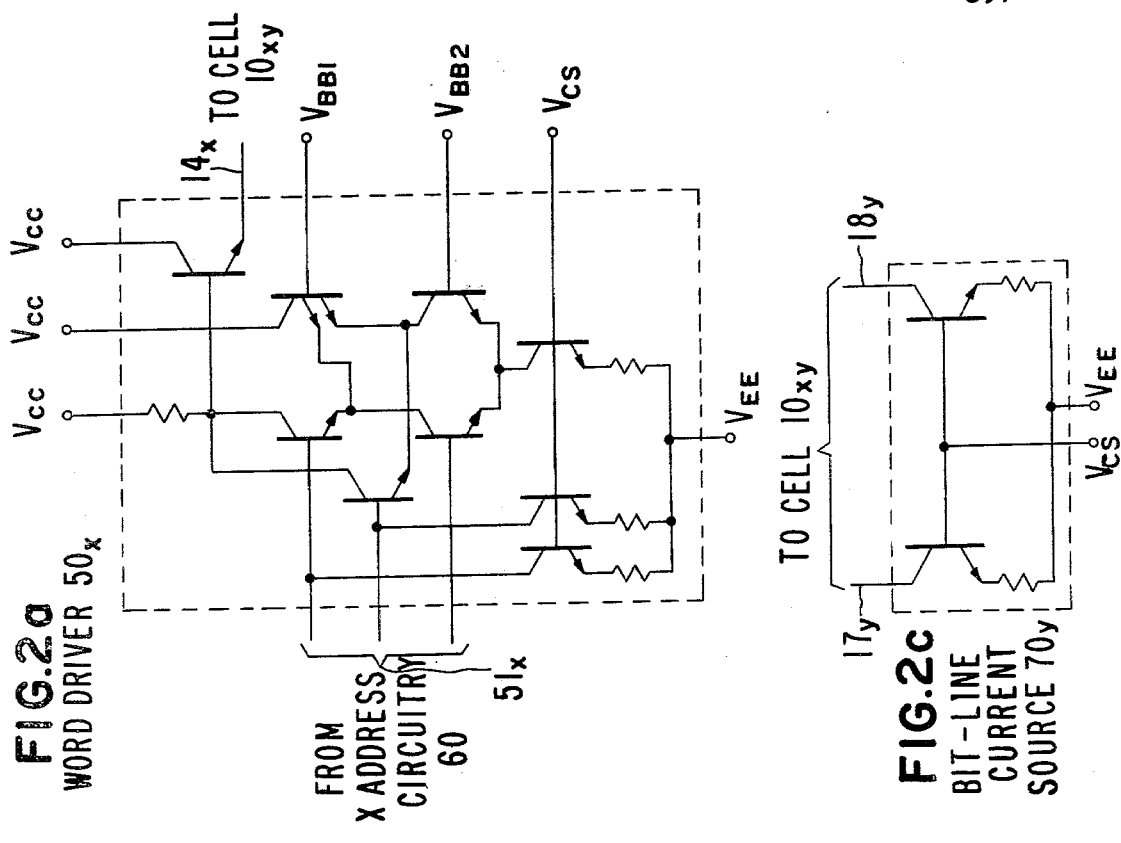
FIG. 2a WORD DRIVER 50$_x$
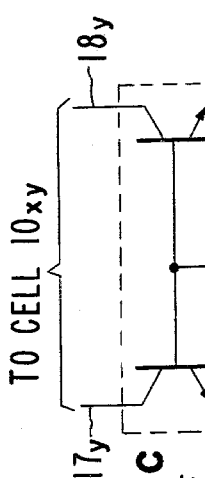
FIG. 2c BIT-LINE CURRENT SOURCE 70$_y$

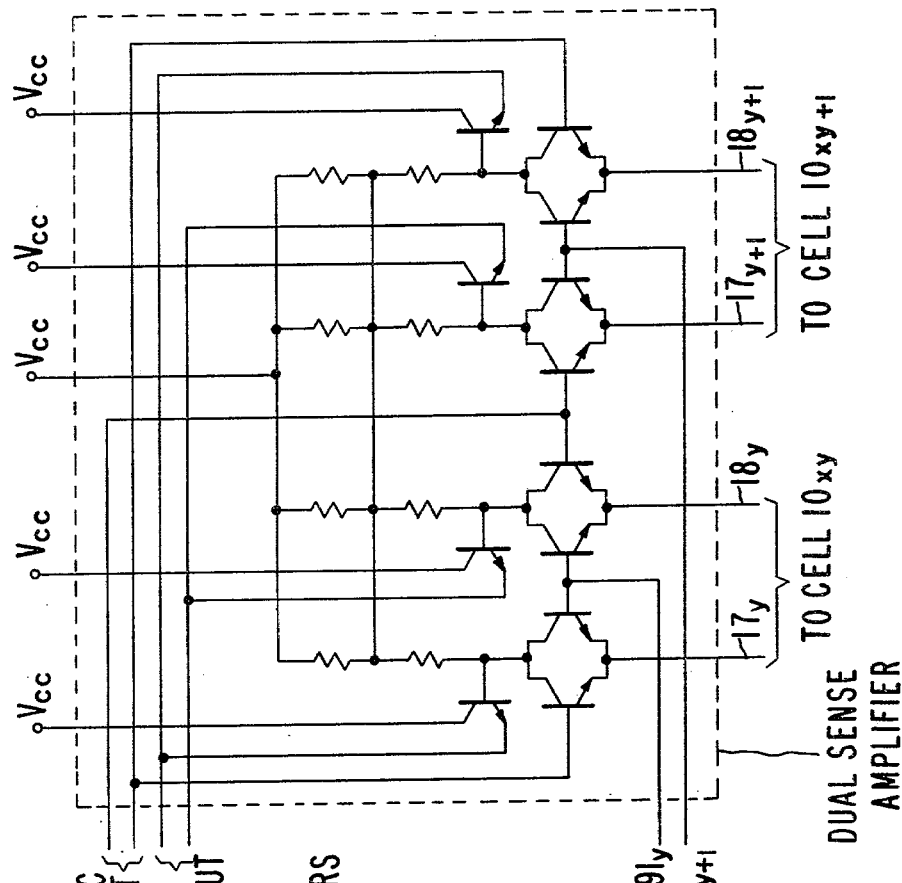
FIG. 2e SENSE AMPLIFIERS 90y
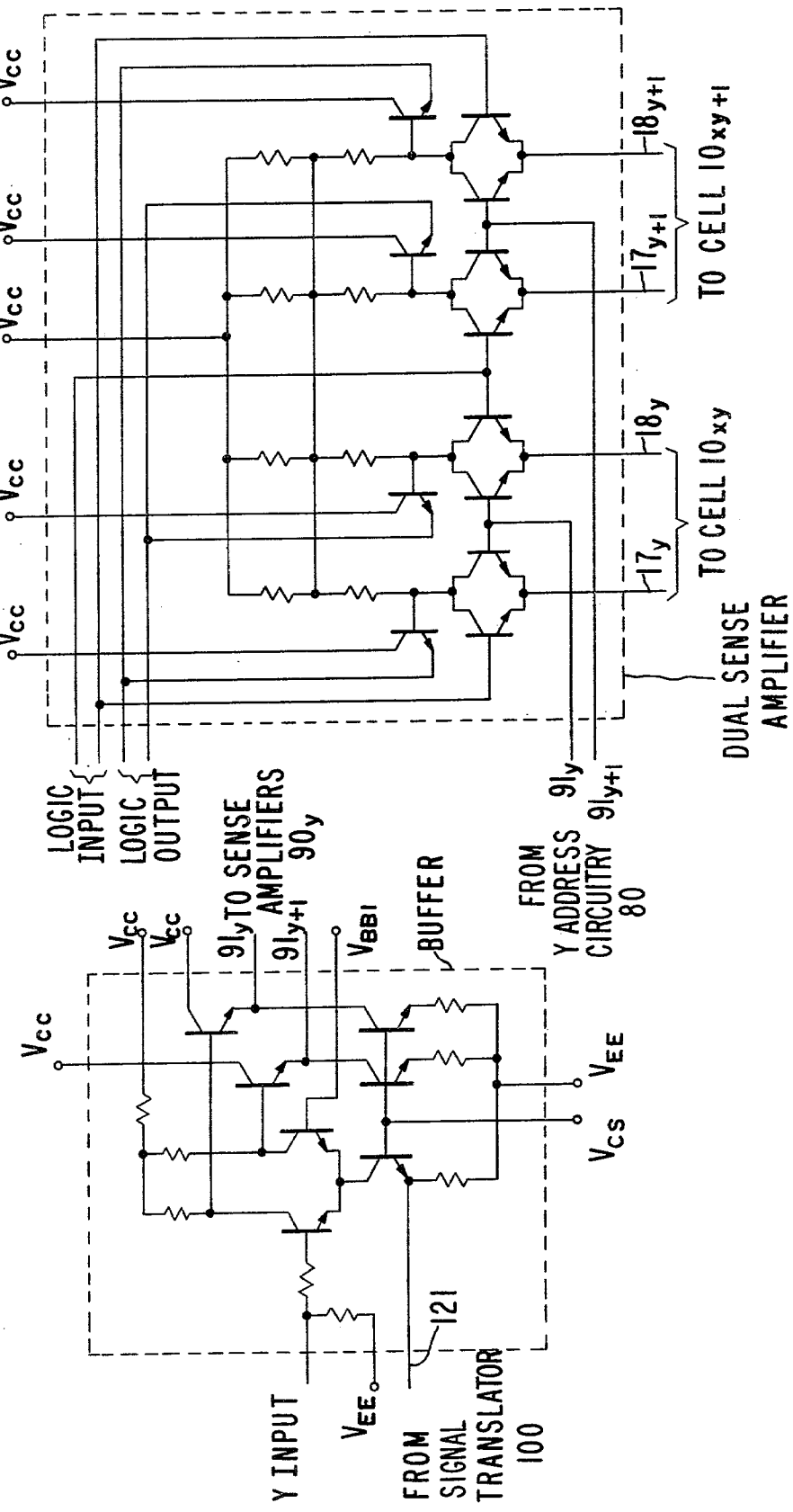
FIG. 2d BIT-LINE ADDRESS CIRCUITRY 80

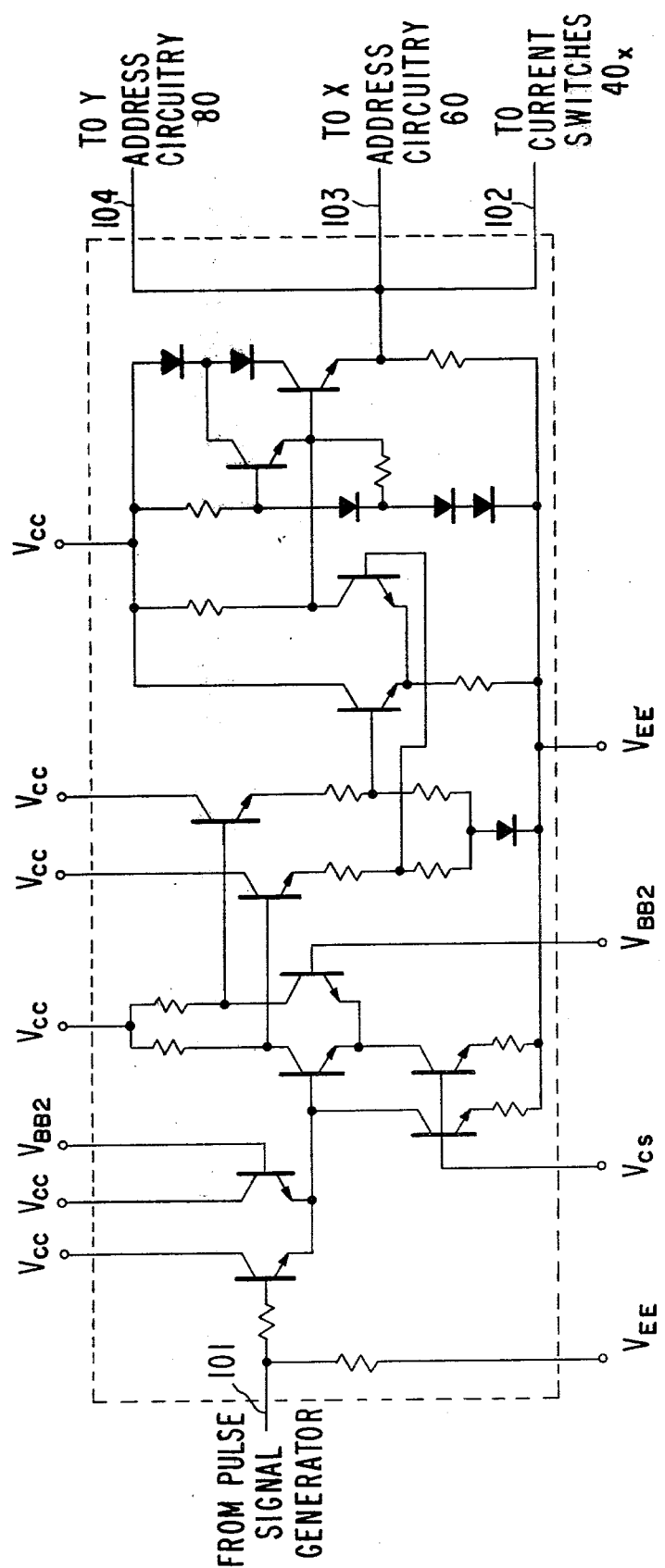

PRESET CIRCUIT FOR INFORMATION STORAGE DEVICES

This is a division of application Ser. No. 931,637, filed Aug. 7, 1978.

BACKGROUND OF THE INVENTION

1. Field of the Invention

This invention relates generally to electronic information storages devices containing bistable cells and in particular to semiconductor circuits for simultaneously erasing all the information stored in the bistable cells of such devices and entering a predetermined new pattern of information into the cells.

2. Prior Art

In some prior art cellular information storage devices, each cell in the device has to be addressed sequentially to erase the information stored in the device so that a new operation can be initiated with either a clean slate or a predetermined pattern of information. This technique is unduly time consuming.

More recently, electronic circuits have come into use in which all the information stored in the cells of an information storage device is simultaneously erased and then simultaneously replaced with a predetermined new pattern of information. The term "set" refers to the entering or writing of "1's" or high logic states into the storage device. The term "reset" refers to the writing of "0's" or low logic states into the storage device. In certain of the more recent circuits, either "set" or "reset" states, or a combination thereof, may be introduced simultaneously into a storage device. That is, the new pattern of information entered into the storage device may consist of all "0's" or all "1's" or a predetermined combination of "1's" and "0's."

An example of the more recent circuits is disclosed by G. W. Brown in U.S. Pat. No. 4,035,784, "Asymmetrical Memory Cell Arrangement," assigned to the assignee of the present invention. Brown employs an arrangement of asymmetrical memory cells in which the leading edge of a pulse causes all the memory cells to be deselected—i.e., not addressed—by diverting all the bit-line and cell-sustaining word-line currents away from each memory cell. During the trailing edge of the pulse, the word-line current then flows through a predetermined side of each cell to establish a desired logic state in the cell. The predetermined side of the cell is determined by the asymmetrical nature of the transistor emitters in each of the Brown cells.

To create the desired logic state in each cell in the Brown circuit, the word-line current resulting from the trailing edge of the pulse must be established before the bit-line current is reestablished in each cell. This makes the Brown device sensitive to race conditions. It is also sensitive to device-leakage currents.

As another example, R. S. Dunn et al. in U.S. Pat. No. 3,634,833, "Associative Memory Circuit," disclose the use of multiple-emitter transistors in a memory circuit.

SUMMARY OF THE INVENTION

In accordance with this invention, an electronic circuit for simultaneously erasing all the present data contained in an electronic information storage device and entering a predetermined new pattern of information into the storage device utilizes one of more bistable semiconductor cells with an additional transistor current-conducting region included on either the left-hand side or the right-hand side of each cell. In a preferred embodiment, each additional current-conducting region is a bipolar transistor emitter.

Holding current is conducted to each cell along a row during normal operation through a standard current-source word line for the row. The additional current-conducting regions in the cells along each row are coupled to an additional word line which connects to a current switch for the row.

At an appropriate pulse signal, the current switch activates to divert row current temporarily from the standard current-source word line to the additional word line, causing the old data to be erased and the new information bits to be entered. When holding current is restored to the cells, the new pattern of information remains in the storage device.

The predetermined information bit for each cell is defined by the side of the cell on which the additional current-conducting region is located. With appropriate patterning—i.e., fabricating the additional current-conducting region on the left-hand side in some cells on the right-hand side in other cells—the predetermined pattern of information may consist of a group of all "0's" or a group of all "1's" or a selected combination of "0's" and "1's." The capability to enter any desired pattern of "0's" and "1's" simultaneously into a storage device is termed a "preset" capability since it combines "set" and "reset" capabilities.

In the present circuit, only the leading edge of the pulse is employed for erasing the old information in the cells and entering the predetermined new pattern of information. The trailing edge of the pulse is immaterial to the operation of the present circuit. Consequently, with respect to this pulse, race conditions do not exist in the present circuit. Furthermore, by using a separate word line for entering the new information bits into the cells along a row, the present circuit is largely insensitive to device-leakage currents.

BRIEF DESCRIPTION OF THE DRAWINGS

FIGS. 2a, 2b, 2c, 2d, 2e, and 2f are circuit diagrams of a typical word driver, a typical word-line address circuitry, a typical bit-line current source, a typical bit-line address circuitry, a typical sense amplifier, and a typical signal translator employed with the memory array of FIG. 1.

Like reference numbers are employed in the drawings to represent the same item or items in the drawings and in the description of the preferred embodiments.

DESCRIPTION OF THE PREFERRED EMBODIMENTS

In accordance with the present invention, an electronic circuit is disclosed for simultaneously erasing all the data stored in an electronic information storage device and entering a predetermined new pattern of data into the storage device. The circuitry for the invention will be described with reference to an M by N array of memory cells, where M and N are positive integers, and N is greater than one. Use of a rectangular storage array is for illustrative purposes only. Other types of storage arrays, such as, for example, linear arrays or arrays of any other operative configuration, may be used with the invention.

The invention will also be described utilizing a single-port bistable random-access memory cell. Use of such a cell is also for illustrative purposes only. The invention may be used with other types of bistable cells, such as, for example, multi-port random-access memory cells, associative memory cells, or shift register cells.

In the following description "preset operation" refers to simultaneously erasing all the present data in the memory array and entering the selected new pattern of information. "Standard operation" or "normal operation" is the complement of preset operation—i.e., "standard operation" refers to the operation of the array at times other than when the array is being operated in the preset mode.

Figure 1:
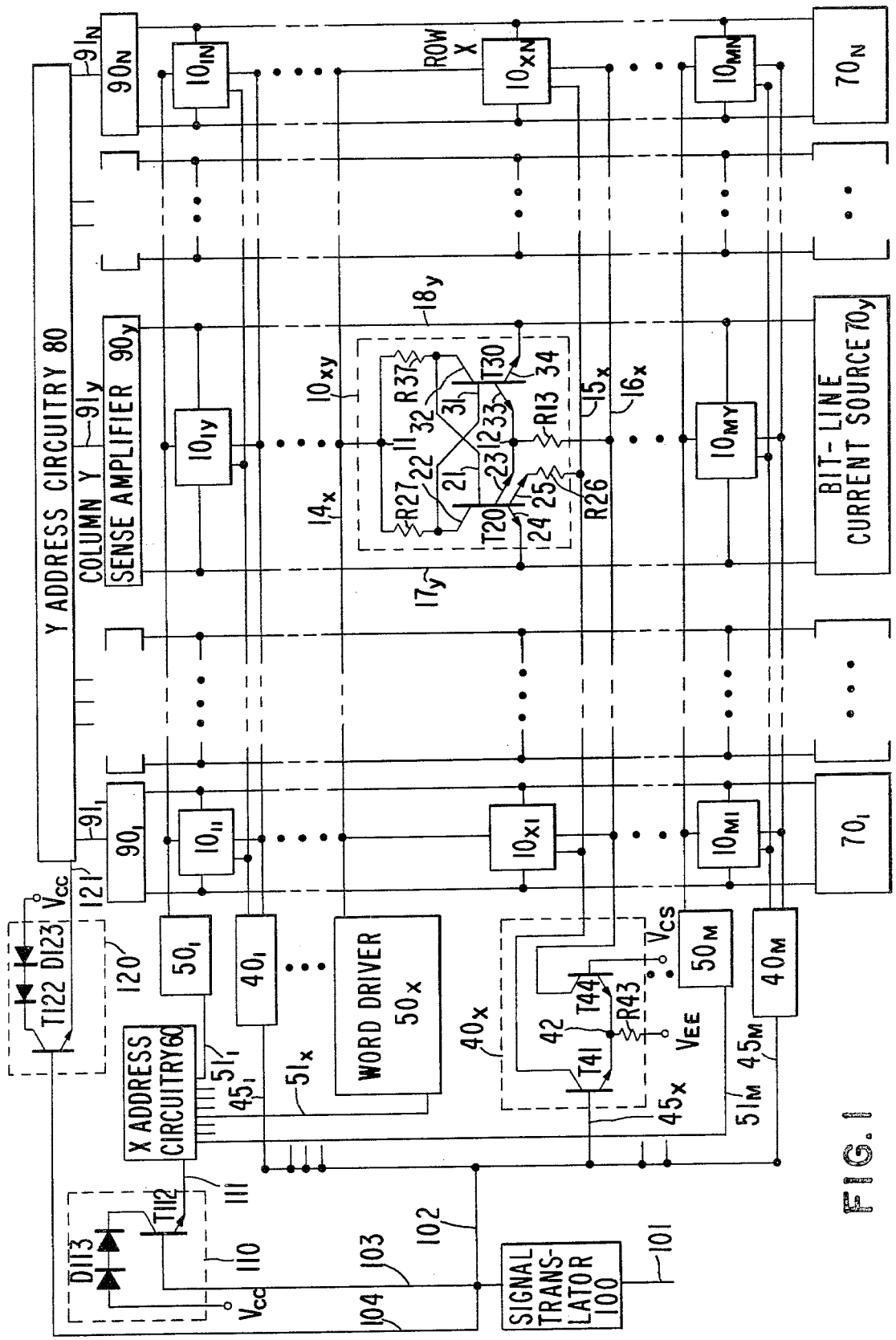
FIG. 1 is a schematic of a memory array used with an embodiment of the circuitry of the present invention.

Referring to the drawings, FIG. 1 shows an embodiment of the circuitry employed in this invention. The memory array comprises M rows of cells and N columns of cells. The cells in any word row X are labeled $10_{X1}, 10_{X2}, \ldots 10_{XY}, \ldots 10_{XN}$, where "X" is the number of the row. X varies from 1 to M. The cells in any bit column Y are labeled $10_{1Y}, 10_{2Y}, \ldots 10_{XY}, \ldots 10_{MY}$, where "Y" is the number of the column. Y varies from 1 to N. "X" is thus indicative of the word-line circuitry, and "Y" is indicative of the bit-line circuitry.

An arbitrary cell in the matrix is labeled $10_{XY}$. In describing an arbitrary cell $10_{XY}$ in the matrix, the subscript "XY" will often be dropped, and the cell will simply be referred to as cell 10. The components of an arbitrary cell 10 will be described without the subscript "XY."

A typical memory cell 10 is formed in a bistable flip-flop configuration using a pair of cross-coupled multiple-emitter transistors T20 and T30. The base 21 of left-hand transistor T20 is coupled to the collector 32 of transistor T30. The base 31 of right-hand transistor T30 is coupled to the collector 22 of transistor T20. The terms "left-hand" and "right-hand" are used solely for the purpose of orientation with respect to the drawings. Resistor R27 is coupled between collector 22 of transistor T20 and circuit point 11. Similarly, resistor R37 is coupled between collector 32 of transistor T30 and circuit point 11. Circuit point 11 is coupled to upper word line $14_X$. Line $14_X$ may alternatively be termed upper word-line conductor $14_X$.

Emitter 23 of transistor T20 and emitter 33 of transistor T30 are coupled to circuit point 12 and then through resistor R13 to standard current-source word line $16_X$. In some embodiments, resistor R13 may be omitted. Line $16_X$ may alternatively be termed standard current-source word-line conductor $16_X$.

Emitter 24 of transistor T20 is coupled to bit line $17_Y$. Emitter 34 of transistor T30 is coupled to bit line $18_Y$. Lines $17_Y$ and $18_Y$ may also be called bit-line conductors $17_Y$ and $18_Y$, respectively.

Cell 10 operates in a bistable mode. Ignoring leakage currents, current flows through either transistor T20 or transistor T30, but not through both transistors T20 and T30, during normal operation. To illustrate the invention, it is arbitrarily defined that cell 10 is in the low logic or "0" state when left-hand transistor T20 is conducting and right-hand transistor T30 is shut off. Correspondingly, cell 10 is in the high-logic or "1" state when right-hand transistor T30 is conducting and left-hand transistor T20 is not conducting. Opposite definitions could as well be adopted.

Emitter 25 is an additional emitter included in memory cell 10. As indicated in FIG. 1, emitter 25 is coupled through resistor R26 to additional word line $15_X$. In some embodiments, resistor R26 may be omitted. Line $15_X$ may alternatively be termed additional word-line conductor $15_X$.

For illustrative purposes, emitter 25 is shown as part of transistor T20 on the left-hand side of cell 10. With emitter 25 located as shown in FIG. 1, cell 10 goes into the "0" state when preset operation is initiated. However, emitter 25 could also be formed as part of transistor T30 on the right-hand side of cell 10. In this case, cell 10 would go into the "1" state when preset operation is initiated. Thus, a "0" can be written into cell 10 by having emitter 25 as part of the left-hand transistor T20, and a "1" can be written into cell 10 by having emitter 25 as part of the right-hand transistor T30. With emitter 25 as part of the left-hand transistor T20 in some cells and part of the right-hand transistor T30 in other cells, any combination of "0's" and "1's" can be written into the array.

Cell 10 is asymmetrical in that additional emitter 25 is included on one side of cell 10. Aside from this asymmetry, the two sides of cell 10 may otherwise be substantially identical. Alternatively, further asymmetries may be introduced into cell 10, as desired, to meet requirements separate from those disclosed herein.

All the cells $10_{X1}, 10_{X2}, \ldots 10_{XY} \ldots 10_{XN}$ in row X are coupled to upper word line $14_X$, to standard current-source word line $16_X$, and to additional word line $15_X$ as described above for arbitrary cell 10. Similarly, all the cells $10_{1Y}, 10_{2Y}, \ldots 10_{XY}, \ldots 10_{MY}$ in column Y are coupled to bit line $17_Y$ and to bit-line $18_Y$ as described above for arbitrary cell 10.

Standard current-source word line $16_X$ and additional word line $15_X$ are connected to current-switch $40_X$. In the embodiment shown in FIG. 1, there is one current switch $40_X$ for each row. In some embodiments, there may be more than one current switch $40_X$ for each row. For simplicity, the subscript "X" will often be dropped in describing the circuitry of current switch $40_X$.

With respect to current switch 40, standard current-source word line $16_X$ is coupled to the collector of current-source transistor T44. The emitter of transistor T44 is coupled to circuit point 42 and then through resistor R43 to voltage source $V_{EE}$. In one embodiment, supply voltage $V_{EE}$ is approximately $-4.5$ volts. The base of transistor T44 is coupled to current-source reference voltage $V_{CS}$. In one embodiment, current-source reference voltage $V_{CS}$ is about $-3.2$ volts. During normal operation, the $V_{CS}$ signal is continuously supplied to the base of transistor T44 while power is supplied to the circuit. This provides a cell-sustaining current through standard current-source word line $16_X$ to cell 10.

Additional word line $15_X$ is coupled to the collector of transistor T41. The emitter of transistor 41 is coupled to circuit point 42 and, as with the emitter of transistor T44, through resistor R43 to voltage source $V_{EE}$. The base of transistor T41 is coupled to line $45_X$, which conveys the signal for initiating preset operation to current switch 40.

Lines $45_1 \ldots 45_M$ leading to all corresponding current switches $40_1 \ldots 40_M$ are coupled through line 102 to signal translator 100. Signal translator 100 modifies the pulse signal for initiating preset operation that enters signal translator 100 through line 101 to convert the entering signal into a form suitable for use in the circuit.

Line 101 connects to a pulse signal generator, which is not shown, for producing an appropriate pulse to initiate preset operation. Signal generators suitable for supplying such pulse signals are well known in the art and, consequently, are not described in detail herein.

The pulse for initiating preset operation may typically be a standard square-wave pulse having a pulse width of about 3.5 nanoseconds. Pulses of other shapes will suffice as long as the pulse amplitude stays above an appropriate level for the entire pulse width.

Upper word line $14_X$ is coupled to word driver $50_X$ which is in turn coupled to word-line address circuitry 60 by way of line $51_X$. Line $51_X$ may consist of a plurality of lines. Circuitry 60 is also denominated X address circuitry 60. As shown in FIG. 1, all the upper word lines $14_1 \ldots 14_M$ are coupled through the corresponding word drivers $50_1 \ldots 50_M$ to X address circuitry 60. A row is addressed by supplying an X address signal to X address circuitry 60 which in turn supplies an appropriate word-driver signal through the appropriate word driver $50_X$ to line $14_X$ of the selected row.

Either X address circuitry 60 or Y address circuitry 80, which is discussed below, is coupled to signal translator 100. In some embodiments both X address circuitry 60 and Y address circuitry 80 may be coupled to signal translator 100. Such an embodiment is shown in FIG. 1.

In X coupling 110, X address circuitry 60 is coupled through line 111 to the emitter of transistor T112. The base of transistor T112 is coupled by way of line 103 to signal translator 100. The collector of transistor T112 is coupled through double diode D113 to voltage source $V_{CC}$. In particular, as shown in FIG. 1, the leading cathode of double diode D113 is connected to the collector of coupling transistor T112, and the trailing anode is connected to voltage source $V_{CC}$. In one embodiment, voltage source $V_{CC}$ is about zero volts.

Each bit column Y has a bit-line current source $70_Y$ connected to bit lines $17_Y$ and $18_Y$ of the corresponding column for supplying bit-line current through bit lines $17_Y$ and $18_Y$. The bit-line current sources $70_Y$ may be interconnected to each other.

Bit lines $17_Y$ and $18_Y$ are connected to sense amplifier $90_Y$ which is in turn coupled to bit-line address circuitry 80 by way of line $91_Y$. Line $91_Y$ may consist of a plurality of lines. Circuitry 80 is also denominated Y address circuitry 80. As depicted in FIG. 1, all the bits lines $17_1 \ldots 17_N$ and $18_1 \ldots 18_N$ are coupled through the corresponding sense amplifiers $90_1 \ldots 90_N$ to Y address circuitry 80. A column is addressed by supplying a Y address signal to Y address circuitry 80 which in turn supplies appropriate signals through the appropriate sense amplifier $90_Y$ to the bit lines $17_Y$ and $18_Y$ of the selected column. The sense amplifier $90_Y$ senses which side of a cell $10_{XY}$, and thus which bit line $17_Y$ or $18_Y$, is conducting current depending on the logic state in the cell $10_{XY}$.

In Y coupling 120, Y address circuitry 80 is coupled through line 121 to the emitter of transistor T122. The base of transistor T122 is coupled by way of line 104 to signal translator 100. The collector of transistor T122 is coupled through double diode D123 to voltage source $V_{CC}$. In particular, as shown in FIG. 1, the leading cathode of double diode D123 is connected to the collector of coupling transistor T122, and the trailing anode is connected to voltage source $V_{CC}$.

Circuitries for word driver $50_X$, word-line address circuitry 60, bit-line current source $70_Y$, bit-line address circuitry 80, sense amplifier $90_Y$, and signal translator 100 are all known in the art. Accordingly, no detailed word descriptions will be given for these items. However, to illustrate a standard type of memory array, typical circuitries are shown in schematic form in FIGS. 2a, 2b, 2c, 2d, 2e, and 2f using standard symbols for word driver $50_X$, word-line address circuitry 60, bit-line current source $70_Y$, bit-line address circuitry 80, sense amplifier $90_Y$, and signal translator 100, respectively. Items $V_{BB1}$ and $V_{BB2}$ in these figures are additional voltage sources.

The circuitries shown in FIGS. 2a, 2b, 2c, 2d, 2e, and 2f are utilized in "16 by 4 Read/Write Register File" manufactured by Fairchild Camera and Instrument Corporation and denoted by product number F100145. The operation of these circuitries is known in the prior art. In particular, see 1977 ECL Data Book, pages 11-39 through 11-42, issued by Fairchild Camera and Instrument Corporation. These pages of this data book are specifically incorporated by reference herein.

X address circuitry 60 shown in FIG. 2b includes a one-of-eight decoder connected to three X address buffers, of which only one of the X address buffers is coupled to signal translator 100. Observe that X address circuitry 60 may utilize several read X address buffers and several write X address buffers and an X switching circuit to switch from the read mode to the write mode and vice versa. Both the read X address buffers and the write X address buffers may employ identical circuitries.

Y address circuity 80 shown in FIG. 2d utilizes a Y address buffer. As with the X address circuitry 60, Y address circuitry 80 may include separate, but otherwise identical, read and write Y address buffers with an appropriate Y switching circuit. FIG. 2e shows two sense amplifiers $90_Y$ coupled together to form a dual sense amplifier which is then coupled to two bit columns.

The circuitry shown in the drawings generally utilizes NPN bipolar transistors. The usage of transistors of the NPN type is for illustrative purposes only. PNP bipolar transistors may be used in place of some or all of the NPN transistors.

The emitter regions of bipolar transistors may be viewed as current-source conducting regions since they supply the current flowing through bipolar transistors. The collector regions receive the current from the emitter regions. Thus, they may be viewed as current-sink conducting regions.

Field-effect transistors may be substituted for the bipolar transistors generally depicted in the drawings. Where field-effect transistors are utilized, the terms "source," "gate," and "drain" should be substituted for the terms "emitter," "base," and "collector" respectively in the description herein.

In field-effect transistors, the sources supply current and thus may be viewed as the current-source conducting regions. The drains then are the current-sink conducting regions.

Methods for manufacturing the various components of the present invention are well known in the semiconductor art. The invention may be constructed with integrated circuits or with discrete components or with both.

In a preferred embodiment, the invention is fabricated according to techniques disclosed in U.S. Pat. No. 3,648,125 on an invention of D. L. Peltzer entitled "Method of Fabricating Integrated Circuits with Oxidized Isolation and the Resulting Structure," assigned to the assignee of the present invention. The methods and structures disclosed therein and particularly in Columns 6-13 of U.S. Pat. No. 3,648,125, are specifically incorporated by reference herein. Certain of these techniques are also disclosed in a paper entitled "Subnanosecond ECL Gate Circuit using Isoplanar II," 1973 IEEE International Solid-State Circuits Conference (14-16 February 1973, Univ. of Pa.), Digest of Technical Papers, pp. 172-173, V. A. Dhaka, J. E. Muschinske, and W. K. Owens. This paper is specifically incorporated by reference herein.

Figure 3:
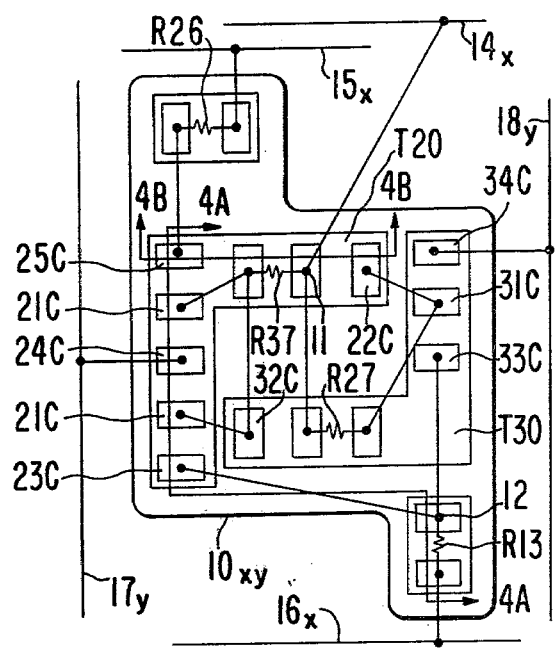
FIG. 3 is a topographical view of a memory cell used in the embodiment of FIG. 1.

FIG. 3 shows a plan view for a preferred embodiment of a typical cell $10_{XY}$ constructed according to the above techniques. As indicated in FIG. 3, the components of transistor T20 are formed in one L-shaped portion of cell $10_{XY}$, and the components of transistor T30 are formed in another L-shaped portion of cell $10_{XY}$. In this embodiment, resistor R37 is integral with transistor T20 and resistor R27 is integral with transistor T30. Items 21C, 22C, 23C, 24C, 25C, 31C, 32C, 33C, and 34C are the conductor contacts to underlying base 21, collector 22, and emitters 23, 24, and 25 of transistor T20 and the conductor contacts to underlying base 31, collector 32, and emitters 33 and 34 of transistor T30. The electrical conductors joining the various cell components are shown schematically as interconnecting lines extending from these conductor contacts.

Figure 4A:
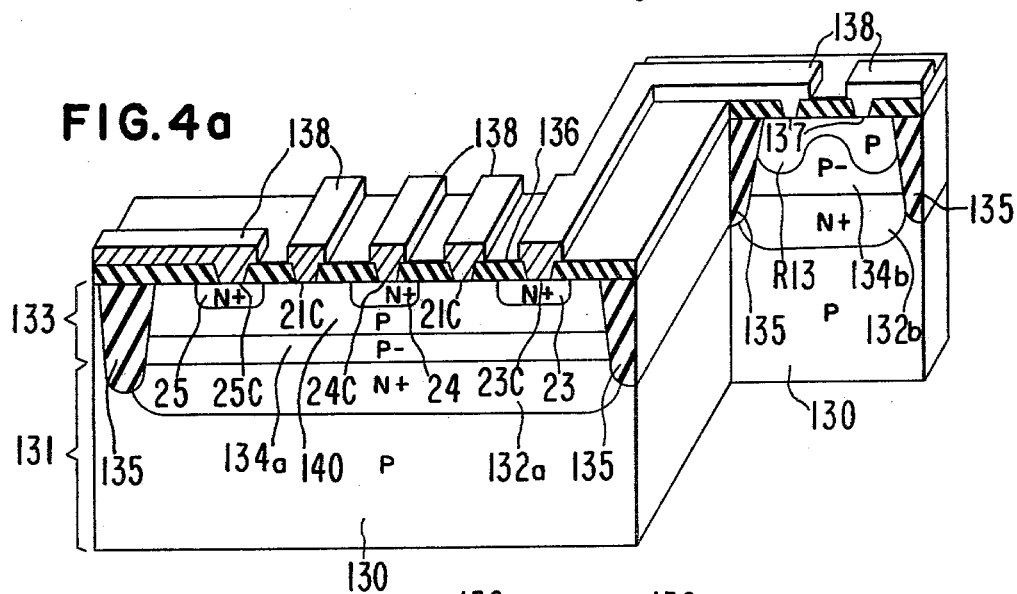
FIGS. 4a and 4b are cross-sectional views, partly schematic, of portions of the memory cell shown in FIG. 3.
Figure 4B:
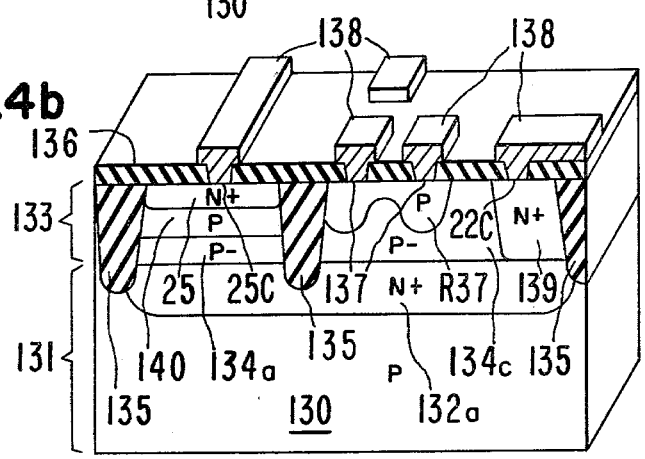

To illustrate specifically the techniques for fabricating the integrated circuits, transistors, resistors, and other components of the present invention, FIGS. 4a and 4b show cross-sectional views, partly perspective, of sections of cell $10_{XY}$ shown in FIG. 3. In particular, FIGS. 4a and 4b display the features of transistor T20 and resistors R13 and R27. The cross-sections are taken through the planes indicated by the arrows in FIG. 3.

Conventional masking, etching, and cleaning techniques, which are well known in the prior art, are employed in creating the various P-type and N-type regions shown in FIGS. 4a and 4b. To simplify the discussion, references to the masking, etching, cleaning, and other well known steps in the semiconductor art are omitted from the following discussion.

Boron is utilized as the P-type impurity for creating the various regions of P-type conductivity on a semiconductor wafer. Phosphorous, arsenic, and antimony are used selectively as the complementary N-type dopants in the wafer. Other appropriate impurities may be used in place of these dopants. In many of the diffusion steps below, the impurity may generally be introduced into the wafer alternatively by ion implantation methods.

The starting material is a silicon substrate 130 of P-type semiconductor material having a thickness indicated by item 131. The resistivity of substrate 130 is 10 to 20 ohm-centimeters. N+ buried layers 132a and 132b are formed in substrate 130 by diffusing an N-type impurity (antimony) into selected regions of substrate 130. The sheet resistance of buried layers 132a and 132b is about 30 to 40 ohms per square.

A P— epitaxial layer is then grown over substrate 130 and N+ buried layers 132a and 132b, typically by either the well known silane process or the well known dichlorosilane process. The original thickness of the P— epitaxial layer is indicated by item 133. The portions of the epitaxial layer remaining essentially unchanged after subsequent processing steps are indicated by items 134a, 134b, and 134c. The resistivty for the epitaxial layer is about 1 ohm-centimeter.

Oxide isolation regions 135 are then formed through the epitaxial layer and into buried layers 132a and 132b for electrically isolating selected portions of the wafer.

N+ region 139 is formed by diffusing an N-type impurity (phosphorous) all the way through a selected portion of the epitaxial layer so that N+ region 139 is contiguous with the corresponding portion of N+ buried layer 132a below N+ region 139. The sheet resistance of N+ region 139 is approximately 60 ohms per square. N+ region 139, in combination with associated N+ region 132a, forms collector 22 for transistor T20.

An electrical insulation layer 136 of silicon nitride is formed on the wafer over the conducting regions and the oxide isolation regions 135. Other insulation materials may be used in addition to or as a substitute for silicon nitride. Holes are later cut through insulation layer 136 to permit subsequent diffusions.

N+ emitter regions 23, 24, and 25 are formed by diffusing an N-type impurity (arsenic) partway through selected portions of the epitaxial layer. The sheet resistance of N+ emitter regions 23, 24, and 25 is approximately 30 ohms per square.

P regions 140, R13, and R37 are formed as shown in FIG. 4a and 4b by diffusing a P-type impurity partway through selected portions of the epitaxial layer. P region 140 extends below emitter regions 23, 24, and 25. The sheet resistance of P regions 140, R13, and R27 is about 600 to 700 ohms per square. P region 140, in combination with P-region 134a, constitutes base 21 for transistor T20.

A pattern of aluminum leads 138 is deposited over the holes and insulation layer 136 to connect the conducting regions in the desired manner.

All the transistors, resistors, and other components of the invention are fabricated in the manner described above for transistor T20 and resistors R13 and R27. Furthermore, semiconductor materials of opposite conductivity type to those described above may be employed to accomplish the same results.

In standard operation—i.e., not in the preset mode—at least one of cells $10_{XY}$ is normally addressed for either read or write operation. Selection—i.e., addressing the desired cell $10_{XY}$—involves manipulating the voltage potential of circuit point 11 of cell $10_{XY}$ in comparison with a reference potential. A word driver signal is first supplied through the word driver $50_X$ of the selected row X to line $14_X$ of row X to raise the potential at circuit points 11 in cells $10_{X1} \ldots 10_{XN}$ of row X. The other rows remain at the reference potential which is lower. The voltage potentials in bit lines $17_Y$ and $18_Y$ of the selected column Y are then lowered so that either the base 21-emitter 24 junction of transistor T20 or the base 31-emitter 34 junction of transistor T30 of selected cell $10_{XY}$ is forward biased beyond the threshhold potential which is about 0.6 volt to 0.8 volt. Bit-line current then flows through either transistor T20 or transistor T30 permitting read or write operation.

In preset operation, all cells $10_{XY}$ are deselected and repatterned. Deselection means that no bit line current can flow through bit lines $17_Y$ and $18_Y$ into cell $10_{XY}$. This is accomplished by adjusting the voltage potentials across the base 21-emitter 24 junction of transistor T20 and the base 31-emitter 34 junction of transistor T30 so that current does not flow across these two base-emitter junctions. In particular, the two base-emitter junctions are either reverse biased or forward biased but below the threshhold potential. There are several ways for effecting deselection.

Consider what occurs in a single cell 10 where X address circuitry 60 is coupled to signal translator 100. The signal for initiating preset operation is transmitted through X address circuitry 60, word driver 50, and upper word line $14_X$ to lower the voltage potential at circuit point 11 to such a level that the base 21-emitter 24 junction of transistor T20 and the base 31-emitter 34 junction of transistor T30 are not forward biased beyond the thresshold potential. No bit-line current flows into cell 10, and cell 10 is thereby deselected.

Alternatively, Y address circuitry 80 may be coupled to signal translator 100 as described above. In this case, the signal is transmitted through Y address circuitry 80 and sense amplifier 90 to raise the potentials in bit lines $17_Y$ and $18_Y$ to such levels that the base 21-emitter 24 junction of transistor T20 and the base 31-emitter 34 junction of transistor T30 are either reversed biased or forward biased below the threshhold potential. This deselects cell 10.

To insure that cell 10 is deselected, both X address circuitry 60 and Y address circuitry 80 may be coupled to signal translator 100 as depicted in FIG. 1. In this situation, the pulse signal causes the potentials in bit lines $17_Y$ and $18_Y$ to be raised and causes the potential at circuit point 11 to drop such that bit-line current does now flow into cell 10 to deselect cell 10.

Simultaneous with the deselection of cell 10, the pulse passes through lines 102 and $45_X$ to current switch $40_X$. Previously, a high current had been flowing either through transistor T20 if cell 10 was in a "0" state or through transistor T30 if cell 10 was in a "1" state. The pulse now activates current switch $40_X$ to interrupt the current flowing through standard current-source word line $16_X$. The current is temporarily diverted through additional word line $15_X$. This causes a high current to flow through emitter 25 and, in the case shown in FIG. 1, through left-hand transistor T20 to create a "0" state in cell 10.

The effect of the pulse is to remove the cell-sustaining current provided either to emitter 23 of transistor T20 or to emitter 33 of transistor T30 through standard current-source word line $16_X$ depending on the present state of cell 10. The current flowing through emitter 25 of transistor T20 creates a low collector voltage in transistor T20. Since the collector 22 of transistor T20 is connected to the base 31 of transistor T30, the low collector voltage for transistor T20 causes a low base voltage for transistor T30, thereby acting to shut off transistor T30 irrespective of the state of transistor T30 before the pulse. This induces a high collector voltage on transistor T30, and, since transistor T30 is cross coupled by way of its collector 32 to the base 21 of transistor T20, there is a high base voltage on transistor T20 which acts to sustain the current travelling through transistor T20 during the pulse.

When the pulse is completed and current is restored through standard current-source word line $16_X$ to cell 10, there is a high base voltage at transistor T20 and a low base voltage at transistor T30 remaining from the pulse. The higher base voltage across transistor T20 acts to keep transistor T20 turned on while current is being returned to standard current-source word line $16_X$. That is, the current flowing in transistor T20 resulting from the pulse creates a bias in favor of sustaining the conducting condition of transistor T20. The result is that, in the embodiment shown in FIG. 1, cell 10 latches in the "0" state with transistor T20 conducting and transistor T30 not conducting.

The preceding events occur in all of cells $10_{XY}$ during preset operation. Consequently, all of the old information bits in cells $10_{XY}$ of the memory array are simultaneously erased as the predetermined new pattern enters the memory array.

As the foregoing description of the circuit operation indicates, the circuit disclosed herein functions largely independently of the time of occurrence of the trailing edge of the pulse that presets the array. The only event that must occur before the pulse is completed is that the currents in bit-lines $17_Y$ and $18_Y$ must be diverted away from cell 10. In some prior art devices, the standard word-line current must be reestablished before the bit-line currents are reestablished at the end of the pulse. That is, there is a race between the two events in these prior art devices. Manufacturing deviations can sometimes cause the events to occur in the wrong order, thereby leading to a malfunction. In the present invention, it is immaterial when the bit-line currents are reestablished because the current flowing through additional emitter 25 ensures that cell 10 will reaches the desired logic state. In short, the circuit disclosed herein is not sensitive to race conditions.

For essentially the same reason, the present invention is not sensitive to device leakage currents. The current flowing through additional emitter 25 is high compared to leakage currents and negates their effect.

While the invention has been described with reference to particular embodiments, the description is solely for the purpose of illustration and is not to be construed as limiting the scope of the invention claimed below. For example, multi-port memories, associative memories, shift registers, or other types of information storage devices may be used with the invention in place of the single-port random-access memory utilized in the above description. Thus, various modifications, changes, and applications may be made by those skilled in the art without departing from the true scope and spirit of the invention as defined by the appended claims.

What is claimed is:

1. An electronic circuit for information bit storage having a capability for erasing an information bit contained in said circuit and entering a predetermined new information bit into said circuit which comprises:
   a memory cell having M transistors (where M is a positive integer) defining at least two distinct states in which said cell may exist, a predetermined state of said distinct states corresponding to said predetermined new information bit and existing when a selected transistor of said M transistors in conducting;
   a current-source conductor coupled to said cell for conducting current thereto to sustain said distinct states;
   an additional current-conducting region formed as part of said selected transistor, said selected transistor conducting when current flows through said additional current-conducting region;
   an additional conductor coupled to said additional current-conducting region for conducting current thereto; and
   a branching current switch for selectively channelling current either to said current-source conductor or to said additional conductor.

2. An electronic circuit for information bit storage having a capability for erasing an information bit stored in said circuit and entering a predetermined new information bit into said circuit which comprises:

a multistable cell having M transistors (where M is a positive integer) arranged in a multistable configuration, thereby to permit said cell to exist in any one of at least two stable states, a predetermined state of stable states corresponding to said predetermined new information bit and existing when a selected transistor of said M transistors is conducting;

an additional current-conducting region formed as part of said selected transistor, said selected transistor conducting when current flows through said additional current-conducting region;

a current-source conductor coupled to said cell for conducting current thereto to sustain said stable states;

an additional conductor coupled to said additional current-conducting region for conducting current thereto; and a branching current switch coupled to said conductors for selectively channelling current either to said current-source conductor or to said additional conductor.

3. An electronic circuit for erasing an information bit contained in a memory cell and entering a predetermined new information bit into said cell, thereby to set said cell in a predetermined state of at least two distinct states, wherein said cell includes M transistors (where M is a positive integer) defining said distinct states and wherein said distinct states are sustainable by current provided through a current-source conductor coupled to said cell, said circuit comprising:

an additional current-conducting region formed as part of a selected transistor of said M transistors, said predetermined state existing when current flows through said additional current-conducting region to cause said selected transistor to conduct;

an additional conductor coupled to said additional current-conducting region for conducting current thereto; and a branching current switch for selectively channelling current either to said current-source conductor or to said additional conductor.

4. An electronic circuit for erasing an information bit stored in a multistable cell and entering a predetermined new information bit into said cell, thereby to set said cell in a predetermined state of at least two stable states, wherein said cell includes M transistors (where M is a positive integer) arranged in a multistable configuration and wherein said stable states are sustainable by current provided through a current-source conductor coupled to said cell, said circuit comprising:

an additional current-conducting region formed as part of a selected transistor of said M transistors, said predetermined state existing when current flows through said additional current-conducting region to cause said selected transistor to conduct;

an additional conductor coupled to said additional current-conducting region for conducting current thereto; and a branching current switch coupled to said conductors for selectively channelling current either to said current-source conductor or to said additional conductor.

5. An electronic circuit as in claim 1, 2, 3, or 4 and further including at least one current source coupled to said current switch.

6. An electronic circuit as in claim 5 wherein M is greater than one.

7. An electronic circuit as in claim 5 wherein said selected transistor is a bipolar transistor.

8. An electronic circuit as in claim 1, 2, 3, or 4 wherein M is greater than one.

9. An electronic circuit as in claim 1, 2, 3, or 4 wherein said selected transistor is a bipolar transistor.

10. An electronic circuit as in claim 9 wherein M is greater than one.

11. An electronic circuit as in claim 1, 2, 3 or 4 wherein each transistor is a bipolar transistor.

12. An electronic circuit as in claim 11 wherein M is greater than one.

* * * * *